United States Patent
Azenkot et al.

(10) Patent No.: US 9,948,427 B2
(45) Date of Patent: Apr. 17, 2018

(54) HIGH SPEED ADD-COMPARE-SELECT FOR VITERBI DECODER

(71) Applicant: Applied Micro Circuits Corporation, Sunnyvale, CA (US)

(72) Inventors: Yehuda Azenkot, San Jose, CA (US); Bart Zeydel, El Dorado Hills, CA (US)

(73) Assignee: MACOM Connectivity Solutions, LLC, Lowell, MA (US)

( * ) Notice: Subject to any disclaimer, the term of this patent is extended or adjusted under 35 U.S.C. 154(b) by 0 days.

(21) Appl. No.: 14/961,228

(22) Filed: Dec. 7, 2015

(65) Prior Publication Data

US 2017/0163380 A1    Jun. 8, 2017

(51) Int. Cl.
H03M 13/29    (2006.01)
H04L 1/00    (2006.01)

(52) U.S. Cl.
CPC .................... H04L 1/0054 (2013.01)

(58) Field of Classification Search
CPC .................................. H03M 13/41
USPC .................. 714/795, 796, 792, 780
See application file for complete search history.

(56) References Cited

U.S. PATENT DOCUMENTS

| | | | |
|---|---|---|---|
| 7,860,181 B2 | 12/2010 | Yamagishi et al. | |
| 2003/0120996 A1 | 6/2003 | D'Arcy et al. | |
| 2004/0177304 A1* | 9/2004 | Mathew | H03M 13/6502 714/746 |
| 2005/0268210 A1* | 12/2005 | Ashley | G11B 20/18 714/792 |
| 2007/0106926 A1 | 5/2007 | Lee et al. | |
| 2007/0266303 A1 | 11/2007 | Shih | |
| 2009/0187813 A1* | 7/2009 | Haratsch | H03M 13/4107 714/795 |
| 2009/0313531 A1* | 12/2009 | Ashley | H03M 13/395 714/792 |
| 2009/0319876 A1 | 12/2009 | Chiba | |

* cited by examiner

*Primary Examiner* — Fritz Alphonse

(57) ABSTRACT

System and method of comparing-selecting state metric values for high speed Viterbi decoding. In an Add-Compare-Select (ACS) unit, a select control signal is produced by Boolean operations on comparator decision signals and used to control a multiplexer structure. The comparator decision signals can be generated in parallel by an array of comparators comparing all possible pairs of a set of state metrics values. The Boolean operations are predefined through Boolean algebra that uses the decision signals as variables and complies with restriction imposed by the selection criteria, e.g., to select an minimum or maximum value of the set of state metrics values. The Boolean operations are performed by a logic module implemented using basic logic gates, such as AND, OR and NOT. As a result, the multiplexer structure that receives the set of input values can output the optimum value responsive to the select control signal.

19 Claims, 9 Drawing Sheets

250

```
┌─────────────────────────────────────────────────────────────┐
│ Comparing N state metric values in all possible pairs to     │
│ generate decision signals, each decision signal identifying  │──── 251
│ the smaller value of the pair                                │
└─────────────────────────────────────────────────────────────┘
                              │
                              ▼
┌─────────────────────────────────────────────────────────────┐
│ Performing Boolean operations on the decision signals to     │──── 252
│ generate a select signal                                     │
└─────────────────────────────────────────────────────────────┘
                              │
                              ▼
┌─────────────────────────────────────────────────────────────┐
│ Controlling a multiplexer structure by the select signal     │──── 253
└─────────────────────────────────────────────────────────────┘
                              │
                              ▼
┌─────────────────────────────────────────────────────────────┐
│ The multiplexer structure outputting the minimum of the N    │──── 254
│ state metric values according to the select signal           │
└─────────────────────────────────────────────────────────────┘
```

FIG. 2B

HIGH SPEED ADD-COMPARE-SELECT FOR VITERBI DECODER

TECHNICAL FIELD

The present disclosure relates generally to the field of communication systems and, more specifically, to the field of Viterbi decoding in communication systems.

BACKGROUND OF THE INVENTION

The Viterbi algorithm is commonly used for decoding convolution-encoded signals in the field of data communications, data recording, digital signal processing, and etc. For example, in a communication system, data symbols transmitted from a transmitter can be convolution-encoded to improve transmission reliability. During transmission, the signal likely has noise and intersymbol interference (ISI) introduced by channel distortion. Correspondingly, an error-correction decoding process is performed at the receiver to decode the convolution-encoded data symbols, and cancel the intersymbol interference (ISI).

A decoding process involves comparing a received data sequence continuously with theoretically possible transmission data sequences. The level of match is used, as the basis for a decision according to Maximum Likelihood Sequence Estimation (MLSE). More specifically, a trellis diagram is used to describe the coding rules. A Viterbi decoder in the receiver calculates the metrics to determine an optimum path in the trellis diagram that has the best path metric, for example the highest or the lowest path metric depending on the configuration of the Viterbi decoder. The Viterbi decoder uses this selected optimum path to determine the decoded data sequence, and then passes it to a data sink.

According to the Viterbi algorithm, each path metric of a path leading to a specific state is composed of the path metric of a previous state in time and of the branch metric of the branch leading from this previous state to the specific state. The path that has the best path metric up to this time is determined for each state, referred to as a "survival path." During each time step, there are a number of such survivor paths corresponding to the number of different states. Thus, the path metric depends on the path metrics of the previous time step connected to the state via one branch.

Typically a Viterbi decoder includes a branch metric circuit for calculating branch metrics, a path metric circuit for calculating path metrics as a function of the branch metrics, and an Add-Compare-Select (ACS) unit for selecting the optimum path metric from a set of path metrics. FIG. 1 illustrates the configuration of a compare-select circuit 100 in an ACS unit according to the prior art. The ACS unit includes adders (not shown) for calculating path metrics (or state metric values) x1-x4, comparators 101-103 for comparing the path metrics x1-x4 and multiplexers 111-113 for outputting the minimum of x1-x4 based on the comparison results.

More specifically, the first level comparators 101 and 102 compare the state metric values x1-x4 in distinct pairs and output decision signals s1 and s2, each decision signal indicating the smaller value of the corresponding pair. The decisions signals s1 and s2 are directly used as the select control signals for the first level multiplexers 111 and 112. Accordingly, each first level multiplexer 111 or 112 outputs the smaller path metric u1 or u2 of the corresponding pair (x1,x2) or (x3,x4). u1 or u2 are then compared at the second level comparator 103, which produces a decision signal s3 used for controlling the second level multiplexer 113 to output the smaller of u1 and u2, or min(x1, x2, x3, x4).

According this configuration, to output the minimum of the 4 state metrics x1-x4, the first level comparators 101-102, the first level multiplexers 111-112, the second level comparators 103 and the third level multiplexer 113 have to operate in sequence. The sequential nature of this compare-select algorithm contributes to undesirably long latency in an ACS unit. In generally, an ACS unit is the most computationally intensive part of a Viterbi decoder and regarded as the main bottleneck on the decoding speed. Further, such an ACS unit also occupies the greatest chip area and consumes the most power in the decoder. As can be seen from FIG. 1, the complexity of an ACS unit can increase exponentially with the complexity of the respective code used for channel coding.

SUMMARY OF THE INVENTION

Therefore, it would also be advantageous to provide Add-Compare-Select (ACS) units with reduced processing latency and simple circuitry design and so suitable for high speed Viterbi decoding.

Accordingly, embodiments of the present disclosure employ a select control signal resulted from Boolean operations on comparator decision signals to control a multiplexer structure in an ACS unit. The decision signals are generated in parallel by an array of comparators comparing all possible pairs of a set of input values. The Boolean operations are predefined and can be derived through Boolean algebra that uses the decision signals as variables and complies with restriction imposed by the selection criteria, e.g., to select an minimum or maximum value of the set of input values. The Boolean operations are performed by a logic module implemented using basic logic gates composed of AND, OR and NOT. As a result, the multiplexer structure that receives the set of input values can output the optimum value responsive to the select control signal according to the selection criteria.

Compared with the conventional configuration as shown in FIG. 1, an ACS unit according to the present disclosure uses additional comparators at the first level, which, in combination with the logic unit, effectively reduce or eliminate the need for upper level comparison-multiplexing in the ACS unit. As all possible pairs of a set of input values are compared in parallel, the comparison decision signals provide adequate information for the logic unit to produce a select control signal for a multiplexer structure to output an optimum value from the set of input values. Thereby, sequential processing and so the overall processing latency in the ACS unit can be significantly and advantageously reduced. The gate count in the ACS unit can also be reduced due to the simplified design.

In some embodiments, the logic unit is configured to generate a select control signal for controlling ail the select lines of the multiplexer structure in the ACS. In some other embodiments, a first level of multiplexers are used to output candidate values from the set of input values according to the comparison decision signals directly. Concurrently, Boolean operations are performed on the decision signals to generate the select control signal for controlling the upper level multiplexers which accordingly select an optimum value from the candidate values. Due to the parallel operations between the first level multiplexer and the logic unit, the overall latency at ACS unit can be further reduced. Moreover, because the number of the candidate values is smaller than the input values, the logic unit can be relatively simple.

In one embodiment of the present disclosure, a method of selecting a state metric value from a plurality of state metric values in Viterbi decoding includes comparing the plurality of state metric values in pairs to produce a plurality of first decision signals. A respective first decision signal indicates a selected state metric value from a corresponding pair of state metric values. A first select signal is generated by performing Boolean operations on the plurality of first decision signals. A resultant state metric value is selected from the plurality of state metric values based on the first select signal.

The foregoing is a summary and thus contains, by necessity, simplifications, generalizations and omissions of detail; consequently, those skilled in the art will appreciate that the summary is illustrative only and is not intended to be in any way limiting. Other aspects, inventive features, and advantages of the present invention, as defined solely by the claims, will become apparent in the non-limiting detailed description set forth below.

DETAILED DESCRIPTION

Reference will now be made in detail to the preferred embodiments of the present invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of embodiments of the present invention, numerous specific details are set forth in order to provide a thorough understanding of the present invention. However, it will be recognized by one of ordinary skill in the art that the present invention may be practiced without these specific details. In other instances, well-known methods, procedures, components, and circuits have not been described in detail so as not to unnecessarily obscure aspects of the embodiments of the present invention. Although a method may be depicted as a sequence of numbered steps for clarity, the numbering does not necessarily dictate the order of the steps. It should be understood that some of the steps may be skipped, performed in parallel, or performed without the requirement of maintaining a strict order of sequence. The drawings showing embodiments of the invention are semi-diagrammatic and not to scale and, particularly, some of the dimensions are for the clarity of presentation and are shown exaggerated in the drawing Figures. Similarly, although the views in the drawings for the ease of description generally show similar orientations, this depiction in the Figures is arbitrary for the most part. Generally, the invention can be operated in any orientation.

BRIEF DESCRIPTION OF THE DRAWINGS

Embodiments of the present invention will be better understood from a reading of the following detailed description, taken in conjunction with the accompanying drawing figures in which like reference characters designate like elements and in which:

FIG. 2B is a flow chart depicting an exemplary method of comparing and selecting from N state metric values according to predetermined criteria in accordance with an embodiment of the present disclosure;

HIGH SPEED ADD-COMPARE-SELECT FOR VITERBI DECODER

Overall, embodiments of the present disclosure pro vide a compare-select mechanism for Viterbi decoding, which utilizes a select control signal, resulted from predefined Boolean operations on a set of comparator decision signals. The comparator decision signals may be generated by comparing all possible pairs of a set of input values, e.g., state metric values (or path metrics). Controlled by the select control signal, a multiplexer structure receiving the set of input values as input can output an optimum value that conforms to the selection criteria.

Figure 2A:
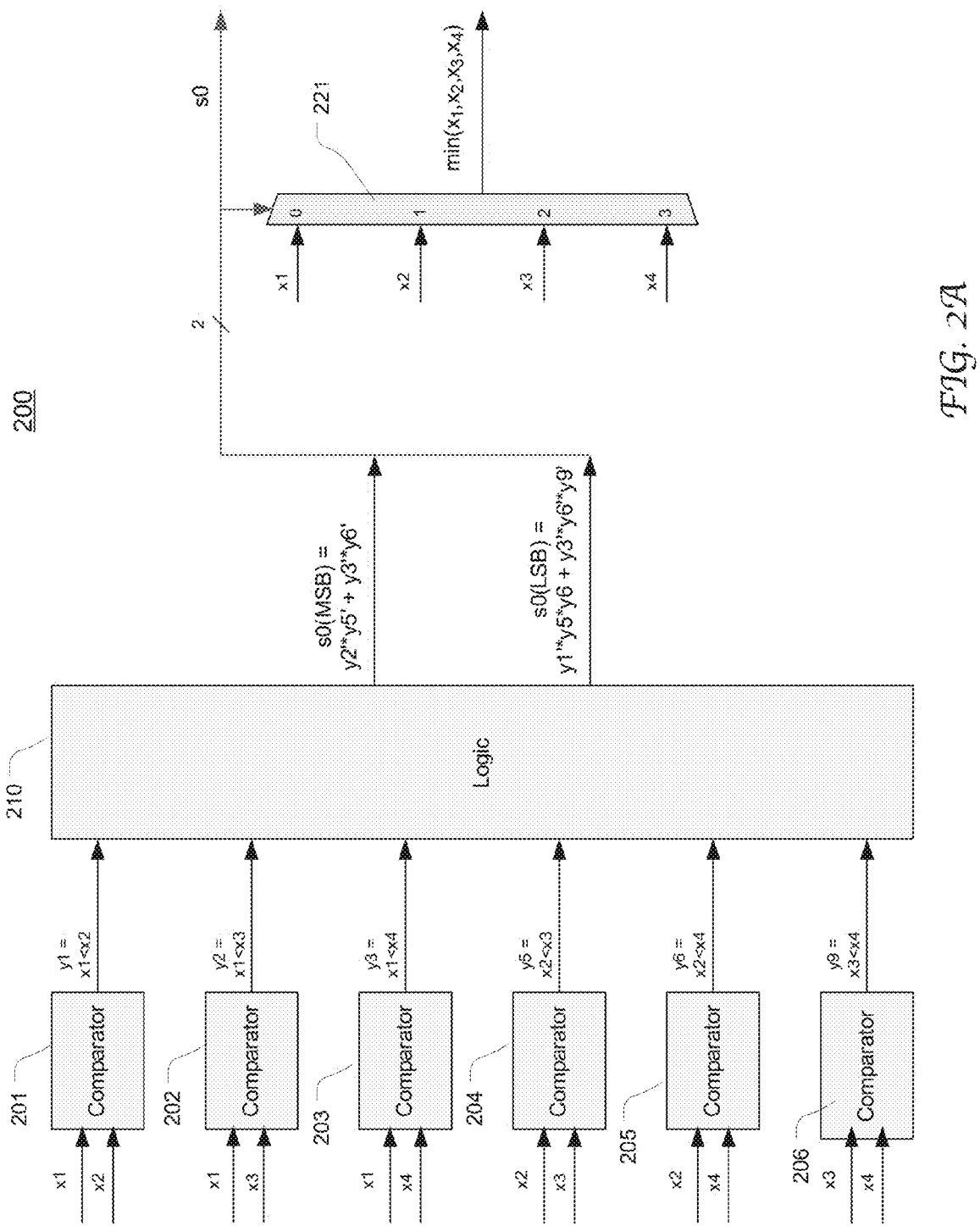
FIG. 2A illustrates the configuration of an exemplary compare-select component 200 configured to select the minimum from four input values in accordance with an embodiment of the present disclosure.

FIG. 2A illustrates the configuration of an exemplary compare-select component 200 configured to select the minimum from four inputs x1-x4 in accordance with an embodiment of the present disclosure. For example, the compare-select component 200 is disposed within an Add-Compare-Select unit in a Viterbi decoder. However, the present disclosure is not limited to this application.

In this example, the compare-select component 200 is configured to output a minimum of the 4 state metrics x1-x4. The compare-select component 200 includes a single level of comparators 201-206, a logic module 210 and a multiplexer 221. The array of comparators operates directly upon the inputs x1-x4 and compares all possible pairs of the inputs x1-x4 in parallel. With 4 inputs, 6 (=3×4/2) comparators are enough to get the comparison between all possible pairs without redundancy. For example, x1>x2 and x2<x1 can share the same comparator by using an additional inverter.

The logic unit 210 performs predefined Boolean operations on the decision signals output from the comparators 201-206 and produces a 2-bit select control signal s0 composed of s0(MSB) and s0(LSB). As shown in FIG. 2A, the s0(MSB) and s0(LSB) are Boolean functions of the decision signals y1, y2, y3, y5, y6 and y9. Derivation of the Boolean functions is described in greater detail below. The 4:1 multiplexer 221 receives x1-x4 at its input and the select control signal s0 at its select lines, and accordingly outputs the minimum of x1-x4. It will be appreciated that the multiplexer 221 may include a single layer or multiple layers of multiplexers which can be implemented in any configuration that is well known in the art.

Figure 1:
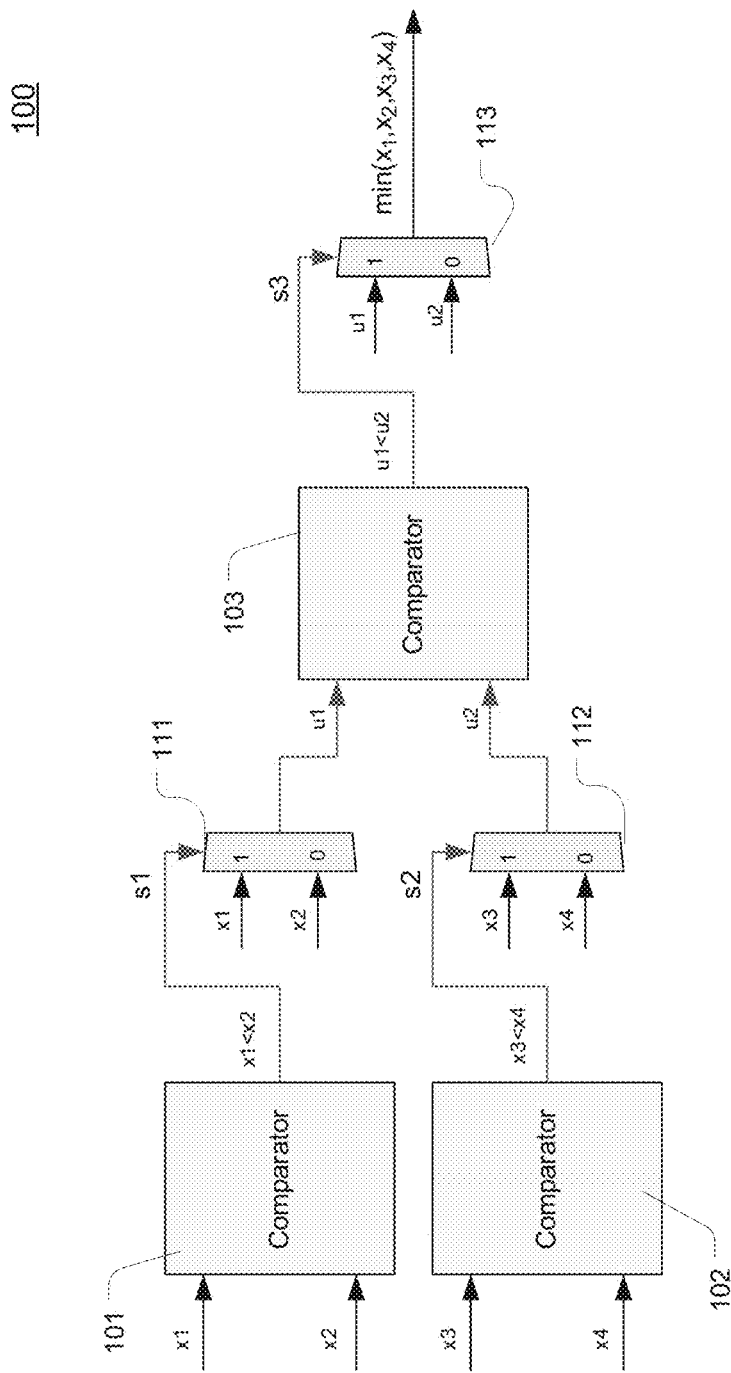
FIG. 1 illustrates the configuration of a compare-select component in an Add-Compare-Select (AGS) unit according to the prior art.

Compared with the conventional configuration as shown in FIG. 1, an ACS unit according to the present disclosure uses additional comparators at the first level, which, in combination with the logic unit, effectively reduce or eliminate the need for additional level comparison-multiplexing in the ACS unit. As all possible pairs of a set of input values are compared in parallel, the comparison decision signals provide adequate information for a logic unit to produce a select control signal for a multiplexer structure to output an optimum (e.g., a minimum) value from the set of input values. Particularly, there is no second level of comparators needed to wait until the first level of comparators to completely their tasks. Thereby, sequential processing and so the overall processing latency in the ACS unit can be significantly and advantageously reduced. The gate count in the ACS unit can also be reduced due to the simplified design.

Herein, in the Boolean algebra expressions, the sign "+" denotes "OR," the sign "*" denotes "AND," and the sign "'" denotes "NOT." It will be appreciated that the present disclosure is not limited to any specific Boolean function for producing a particular multiplexer select signal. Nor is it limited by the method of deriving such a function.

The logic unit 210 implements Boolean operations that can be derived as follows. More specifically, the output signals (or the decision signals) of the 6 comparators 201-206 represent:

a. $y1=x1<x2$
b. $y2=x1<x3$
c. $y3=x1<x4$
d. ~~$y4=y1'=x2<x1$~~
e. $y5=x2<x3$
f. $y6=x2<x4$
g. ~~$y7=y2'=x3<x1$~~
h. ~~$y8=y5'=x3<x2$~~
i. $y9=x3<x4$
j. ~~$y10=y3'=x4<x1$~~
k. ~~$y11=y6'=x4<x2$~~
l. ~~$y12=y9'=x4<x3$~~

Note that the deleted expressions correspond to redundant comparators since they would only produce information that is available already after inverting the result of a pertinent comparator. For example, $y4=x2<x1$ is available as $y1=x1<x2$, thus, $y4=y1'$.

The output s0 of the mm function, where s0=0:3, can be calculated via:

s0=0(00), when $y(1:3)=1$ //x1 is smaller than others (x2,x3,x4).

s0=1(01), when $y(4:6)=1$ //x2 is smaller than others (x1,x3,x4).

s0=2(10), when $y(7:9)=1$ //x3 is smaller than others (x1,x2,x4).

s0=3(11), when $y(10:12)=1$ //x4 is smaller than others (x1,x2,x3).

Boolean algebra can be used to derive the expression for the 2 output bits of s0. The most significant bit (MSB) can be given by:

$$s0(MSB)=y7*y8*y9+y10*y11*y12 \text{ or}$$

$$s0(MSB)=y2'*y5'*y9+y3'*y6'*y9' \qquad \text{Equation 1}$$

It can be shown that s0(MSB) can be simplified to be:

$$s0(MSB)=y2'*y5'+y3'*y6' \qquad \text{Equation 2}$$

s0(LSB) is given by:

$$s0(MSB)=y4*y5*y6+y10*y11*y12$$

$$s0(MSB)=y1'*y5'*y6+y3'*y6'*y9' \qquad \text{Equation 3}$$

FIG. 2B is a flow chart depicting an exemplary method 250 of comparing and selecting from N state metric values according to predetermined criteria in accordance with an embodiment of the present disclosure. For example, in the case that N is equal to 4, the method 250 can be performed by the compare-select component 200 in FIG. 2A.

At 251, the N state metric values are compared in all possible pairs to generate comparison decision signals, each decision signal indicating the smaller value of the pair. At 252, Boolean operations are performed on the decision signals to generate a select signal for multiplexing the N state metric values. The Boolean operations are defined based on the selection criteria, e.g., selecting the minimum of the N state metric values. At 253, the select signal is sent to a multiplexer structure to control the selection from the N state metric values. At 254, the multiplexer structure outputs the minimum of the N state metric values in response to the select signal.

Figure 3A:
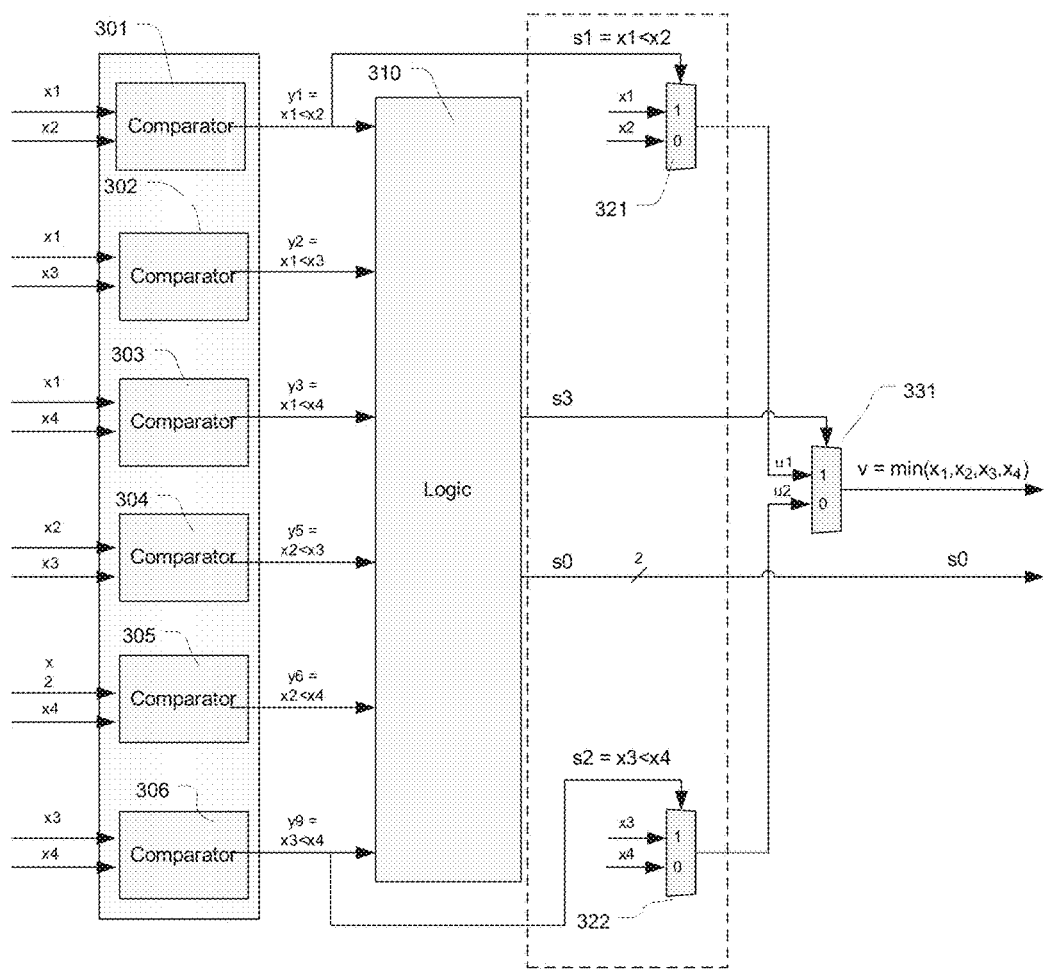
FIG. 3A illustrates the configuration of another exemplary compare-select component configured to select the minimum from four input values in accordance with an embodiment of the present disclosure.

In the embodiment shown in FIG. 2A, the multiplexer 221 is entirely controlled by the select control signal produced from the Boolean logic and so the multiplexing operation starts to perform after the logic unit outputs the select control signal. In some other embodiments, the multiplexing operation can start earlier by comparing the distinct pairs (x1,x2) and (x3,x4) and applying a separate multiplexer (first level multiplexer) on each of these pairs. Then another layer of multiplexer (second level multiplexer) is used to select the minimum of the outputs of the first level multiplexers. FIG. 3A illustrates the configuration of another exemplary compare-select component 300 configured to select the minimum from four inputs x1-x4 in accordance with an embodiment of the present disclosure.

The compare-select component 300 includes a single level of comparators 301-306, the logic unit 310 and two levels of multiplexers composed of 321 and 322 in the first level and 331 in the second level. Similar with the embodiment in FIG. 2A, the array of comparators 301-306 operate directly upon the inputs x1-x4 and compare all possible pairs of the inputs x1-x4 in parallel. With 4 inputs, 6 comparators are enough to get the comparison between all possible pairs without redundancy. The logic unit 310 performs predefined Boolean operations on the decision signals output from the comparators 301-306 and produces a 2-bit select control signal s0, including s0(MSB) and s0(LSB).

Different from the embodiment in FIG. 2A, FIG. 3A shows that the first level multiplexers 321 and 322 multiplex the two distinct pairs (x1,x2) and (x3,x4) using the raw decision signals y1(=s1) and y9(=s2) directly from the pertinent comparators 301 and 306. Thus the outputs u1 and u2 from the first level multiplexers 321 and 322, are the smaller ones of the two distinct pairs, or two "candidate values." u1 and u2 are then subject to multiplexing by the second level multiplexer 331. In this configuration, there is no need for the first level multiplexers 312 and 322 to wait until the logic unit 310 processes the decision signals and produces a select signal, advantageously contributing to further decrease the latency in the add-compare-select process.

More specifically, in parallel with the multiplexing by the first level multiplexers 321 and 322, the logic unit 310 processes the decision signals to produce the select control signal s3 used for the second level multiplexer 331. Thus, s3 can be obtained from just 4 comparator outputs, rather than all the 6 comparators (y1,y2,y3,y5,y6,y9), because the pairs (x1,x2) and (x3,x4) are already compared. Thus, the Boolean logic 310 can be simpler the Boolean logic 210 in FIG. 2A. The second level multiplexer 331 receives u1 and u2 at its input and s3 at its select line, and accordingly outputs the smaller one (=v) of u1 and u2 which is the minimum of x1-x4.

The select signal s3 in FIG. 3A can be derived based on the following statements:

$s3=1$, where the minimum is $x1$ or $x2$, when: $y(2:3)=1$ or $y(5:6)=1$.

$s3=0$, where the minimum is $x3$ or $x4$, when: $y(7:8)=1$ or $y(10:11)=1$.

Thus, s3 is given by (using when it's 1 only):

$$s3 = y2*y3 + y5*y6 \qquad \text{Equation 4}$$

The equation for s1 is:

$s1=1$, where the minimum is $x1$, when $y(1)=1$.

$s1=0$, where the minimum is $x2$, when: $y(4)=1$.

$$s1 = y1 \qquad \text{Equation 5}$$

For s2:

$s2=1$, where the minimum is $x3$, when: $y(9)=1$.

$s2=0$, where the minimum is $x4$, when: $y(12)=1$.

$$s2 = y9 \qquad \text{Equation 6}$$

The signal s0(LSB and MSB) can be the resulted from the same Boolean functions as shown in Equations 1 and 2. Table 1 shows a second way to obtain s0 by using the calculated values of s1, s2, s3.

TABLE 1

| min | s1 | s2 | s3 | s0 |
| --- | --- | --- | --- | --- |
| x1 | 1 | x | 1 | 00 |
| x2 | 0 | x | 1 | 01 |
| x3 | x | 1 | 0 | 10 |
| x4 | x | 0 | 0 | 11 |

The equations for s0(MSB & LSB) based on the already calculated MUX selections s1, s2, s3 can be given by:

$$s0(MSB) = s1*s3' + s1'*s3' - (s1+s1')*s3' - s3' \text{ or}$$

$$s0(LSB) = s1'*s3 + s2'*s3'$$

Figure 3B:
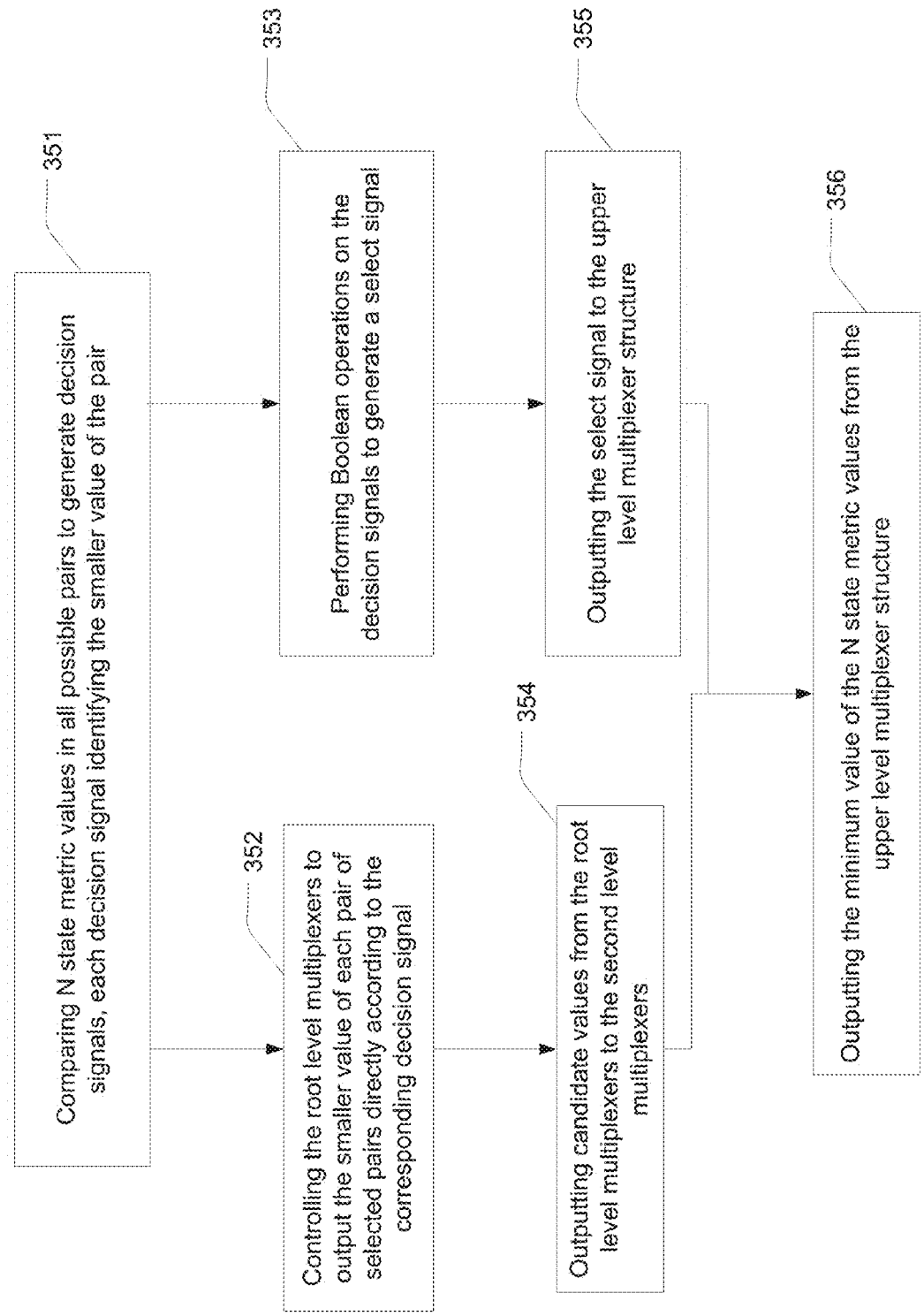
FIG. 3B is a flow chart depicting an exemplary method of comparing and selecting from N state metric values according to predetermined criteria in accordance with another embodiment of the present disclosure.

FIG. 3B is a flow chart depicting an exemplary method 350 of comparing and selecting from N state metric values according to predetermined criteria in accordance with another embodiment of the present disclosure. For example, in the case that N is equal to 4, the method 350 can be performed by the compare-select component 300 in FIG. 3A; and in the case that N is equal to 16, the method 350 can be performed by the compare-select component 360 shown in FIG. 4, as described below.

At 351, the N state metric values are compared in all possible pairs to generated decision signals, where each decision signal identifies the smaller value of the pair. The decision signals are then processed by two parallel paths. At 352, the decision signals from a set of selected comparators are directly used to control the root level multiplexers. In the examples shown in FIGS. 3A and 4, the set of selected comparators are associated with distinct pairs of the N state metric values and so composed of N/2 comparators. However, the present disclosure is not limited to this implementation.

At 354, in response to die decision signals, candidate values are output from the root level multiplexers, where each candidate value is the minimum of a respective pair in the distinct pairs. The candidate values are then subject to upper level multiplexing. More specifically, in parallel with the root level multiplexing at 352 and 354, Boolean operations are performed on the decision signals to generate a select signal at 353. At 355, the select signal is sent to an upper multiplexer structure at 355. At 356, in response to the select signal, the upper level multiplexer outputs the minimum of the candidate values which are the minimum of the N state metric values, it will be appreciated that the upper level multiplexer structure may include a single layer or multiple layers arranged in any suitable configuration that is well known in the art. The Boolean operations and so the select signal may vary with the configuration of the upper level multiplexer structure.

Figure 4:
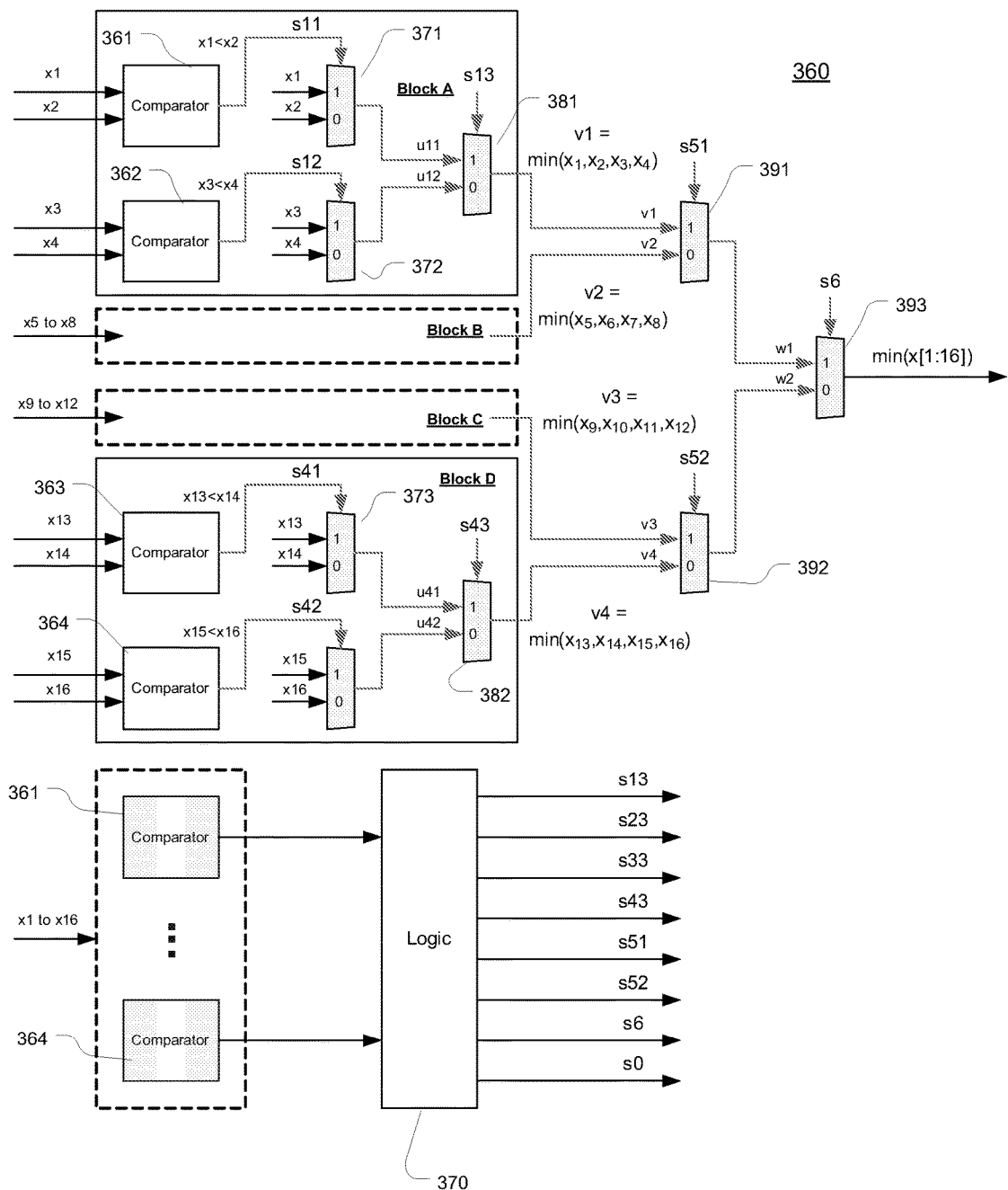
FIG. 4 illustrates the configuration of an exemplary compare-select component configured to select the minimum from 16 input values in accordance with an embodiment of the present disclosure.

In some more complex Viterbi decoders, the ACS unit needs to find the minimum value out of 16 input values. The process as described with reference to FIG. 3B can be applied to select from 16 values. FIG. 4 illustrates the configuration of an exemplary compare-select component 360 configured to select the minimum from 16 inputs x1-x16 in accordance with an embodiment of the present disclosure.

The compare-select component 360 includes a single level of comparators (e.g., 361-364), which operate directly upon the inputs x1-x16 and compare all possible pairs of the inputs x1-x16 in parallel. The total number of possible comparators between all possible pairs can be 15×15=225. However, with 16 inputs, 120 (=16×15/2) comparators are enough to get the comparison between all possible pairs without redundancy.

The compare-select component 360 further includes 8 root level multiplexers (e.g., 371, 372 and 373), upper level multiplexers (e.g., 381, 382, 391, 392 and 393) arranged in a hierarchy, and a logic unit 370. The root level multiplexers multiplexing the 16 inputs in 8 distinct pairs, resulting in 8 candidate values (e.g., u11, u12, u41 and u42). The 8 candidate values are then sent to the upper level multiplexers for outputting the min(x[1:16]). In this example, the root level multiplexers are controlled directly by the decision signals (e.g., s11, s12, s41 and s42) of the 8 comparators coupled to the distinct pairs; whereas the upper level multiplexers are controlled by the select signals (e.g., s13, s43, s51, s52 and s6) produced from the logic unit 370. The select signals to the upper level multiplexers are calculated in parallel based on the comparators that operate on some of the inputs x1-x16.

A partial list of comparators that are needed is:
- $y1,1 = x1 < x2$
- $y1,2 = x1 < x3$
- $y1,3 = x1 < x4$
- $y1,4 = x1 < x5$
- $y1,5 = x1 < x6$
- $y1,6 = x1 < x7$
- $y1,7 = x1 < x8$
- $y1,8 = x1 < x9$
- $y1,9 = x1 < x10$
- $y1,10 = x1 < x11$
- $y1,11 = x1 < x12$

- y1,12=x1<x13
- y1,13=x1<x14
- y1,14=x1<x15
- y1,15=x1<x16
- y2,1=y1,2'=~~x2<x4~~
- y2,2=x2<x3
- y2,3=x2<x4
- y2,4=x2<x5
- y2,5=x2<x6
- y2,6=x2<x7
- y2,7=x2<x8
- y2,8=x2<x9
- y2,9=x2<x10
- y2,10=x2<x11
- y2,11=x2<x12
- y2,12=x2<x13
- y2,13=x2<x14
- y2,14=x2<x15
- y2,15=x2<x16
- y3,1=y1,3'=~~x3<x1~~
- y3,2=y2,3'=~~x3<x2~~
- y3,3=x3<x4
- y3,4=x3<x5
- y3,5=x3<x6
- y3,6=x3<x7
- y3,7=x3<x8
- y3,8=x3<x9
- y3,9=x3<x10
- y3,10=x3<x11
- y3,11=x3<x12
- y3,12=x3<x13
- y3,13=x3<x14
- y3,14=x3<x15
- y3,15=x3<x16
- y4,1=y1,4'=~~x4<x1~~
- ...

In order to reduce the latency, the multiplexing process can start immediately by using 8 comparators for the pairs: x(1,2), x(3,4), x(5,6), x(7,8), x(9,10), x(11,12), x(13,14) & x(15,16). While these 8 multiplexers process the input signals, the select controls of the next level multiplexers is calculated in parallel based on some comparators that operate on some of the inputs x(1:16).

The component 360 includes 4 sub-blocks (Blocks A-D) yielding the 4 outputs, namely v1, v2, v3 & v4. Each sub-block produces the minimum value out of 4 inputs. Then, the minimum of v1 to v4 is obtained via 3 multiplexers 391, 392 and 393. In this embodiment, to reduce latency, the select controls of the last 3 multiplexers s51, s52 & s6 are calculated based on the results from comparing the inputs x1-16. In some other embodiments, s51, s52 & s6 can be calculated based on the results from comparing the v1-v4 (as described in greater detail with reference).

The inputs x(1:16) are divided into 4 groups, where each has 4 inputs, x1 to x4, x5 to x8, x9 to x13, and x13 to x16. Each group is first processed by a sub-block. The minimum of each 4 input values can be found using the technique described with reference to FIG. 2A for the case of 4 input x1 to x4. The outputs of the first group are:

u11=min(x1,x2)
u12=min(x3,x4)

The select s11 and s12 are obtained quickly from the comparator outputs x1<x2 and x3<x4. Then, the select control s13 of the second level multiplexer 381 is obtained after post-processing the comparator outputs. Similar as presented above, s13 is given by:

$$s13 = y2 * y3 + y5 * y6 \quad \text{Equation 7}$$

and,
- y1=x1<x2
- y2=x1<x3
- y3=x1<x4
- y4=y1'=~~x2<x1~~
- y5=x2<x3
- y6=x2<x4
- y7=y2'=~~x3<x1~~
- y8=y5'=~~x3<x2~~
- y9=x3<x4
- y10=y3'=~~x4<x4~~
- y11=y6'=~~x4<x2~~
- y12=y9'=~~x4<x3~~

The same operation is applied on the other 3 sub-blocks, where the following 4 minimum values are found:

$$v1 = \min(x1, x2, x3, x4)$$

$$v2 = \min(x5, x6, x7, x8)$$

$$v3 = \min(x9, x10, x11, x12)$$

$$v4 = \min(x13, x14, x15, x16)$$

Next is to find min(v1,v2,v3,v4) and get the values of the upper multiplexer select signals, s51, s52, & s6. One way to find min(v1,v2,v3,v4) is to find the minimum of v1,v2,v3 and v4 the same way as used in finding the min(x1,x2,x3,x4). However, this approach has relatively higher latency because it can only start calculating after v1 to v4 are available.

In this embodiment, in order to find the s51, s52, & s6, the comparators can start processing the inputs x(1:16) immediately, and there is no need to wait until v1 to v4 are obtained. The select signal s51 can be derived as follows. Note in this step, it does not matter if the minimum is x1, x2, x3 or x4. So the relationship between x1 and x2, x3, or x4 does not matter, because the min(x1,x2,x3,x4) was selected already.

w1 is the minimum out of x1 to x8 when:

x1<x2=y1 (the relationship between x1 & x2 does not matter, thus ignore this requirement.)
x1<x3=y2 (the relationship between x1 & x3 does not matter, thus ignore this requirement.)
x1<x4=y3 (the relationship between x1 & x4 does not matter, thus ignore this requirement.)
x1<x5
x1<x6
x1<x7
x1<x8

The similar process applies for x2, x3 & x4. Therefore, s51 is given by:

$$s51 = x1<x5 * x1<x6 * x1<x7 * x1<x8 + \\ x2<x5 * x2<x6 * x2<x7 * x2<x8 + \\ x3<x5 * x3<x6 * x3<x7 * x3<x8 + \\ x4<x5 * x4<x6 * x4<x7 * x4<x8$$

s52 can be derived similarly to s51, by adding 8 to all indexes of the equation of s51:

$$s52 = x9<x13 * x9<x14 * x9<x15 * x9<x16 + \\ x10<x13 * x10<x14 * x10<x15 * x10<x16 + \\ x11<x13 * x11<x14 * x11<x15 * x11<x16 + \\ x12<x13 * x12<x14 * x12<x15 * x12<x16$$

The selection s6=(w1<w2) is derived as follows. Note it does not matter if the minimum is x1 to x8. So the relationship between x1 and x2 to x8 does not matter, because w1=min(x1 to x8) was selected already.

x1 is the minimum out of x1 to x16 when:
x1<x2=y1 (the relationship between x1 & x2 does not matter, thus ignore this requirement.)
x1<x3=y1 (the relationship between x1 to x3 does not matter, thus ignore this requirement.)
x1<x4=y3 (the relationship between x1 & x4 does not matter, thus ignore this requirement.)
x1<x5 (the relationship between x1 & x5 does not matter, thus ignore this requirement.)
x1<x6 (the relationship between x1 & x6 does not matter, thus ignore this requirement.)
x1<x7 (the relationship between x1 & x7 does not matter, thus ignore this requirement.)
x1<x8 (the relationship between x1 & x8 does not matter, thus ignore this requirement.).
x1<x9
x1<x10
x1<x11
x1<x12
x1<x13
x1<x14
x1<x15
x1<x16

The same process applies for x2 to x8. Thus s6 is given by:

$$s6=x1<x9*x1<x10*x1<x11*x1<x12*x1<x13*x1<x14*x1<x15*x1<x16+x2<x9*x2<x10*x2<x11*x2<x12*x2<x13*x2<x14*x2<x15*x2<x16+x3<x9*x3<x10*x3<x11*x3<x12*x3<x13*x3<x14*x3<x15*x3<x16+x4<x9*x4<x10*x4<x11*x4<x12*x4<x13*x4<x14*x4<x15*x4<x16+x5<x9*x5<x10*x5<x11*x5<x12*x5<x13*x5<x14*x5<x15*x5<x16+x6<x9*x6<x10*x6<x11*x6<x12*x6<x13*x6<x14*x6<x15*x6<x16+x7<x9*x7<x10*x7<x11*x7<x12*x7<x13*x7<x14*x7<x15*x7<x16+x8<x9*x8<x10*x8<x11*x8<x12*x8<x13*x8<x14*x8<x15*x8<x16$$

The index s0 of the min(x1 to x16) can be derived as follows, where s0=0 to 15 (4 bits).
s0(bit 0=LSB)=?
s0(bit 1)=?
s0(bit 2)=?
s0(bit 3=MSB)=?
s0=0000, when x1 is the minimum, or when the following 15 comparators are "1":
x1<x2
x1<x3
x1<x4
x1<x5
x1<x6
x1<x7
x1<x8
x1<x9
x1<x10
x1<x11
x1<x12
x1<x13
x1<x14
x1<x15
x1<x16
s0=0001 when x2 is the minimum, or when the following 15 comparators are "1":
x2<x1
x2<x3
x2<x4
x2<x5
x2<x6
x2<x7
x2<x8
x2<x9
x2<x10
x2<x11
x2<x12
x2<x13
x2<x14
x2<x13
x2<x16
s=0010, when x3 is the minimum, or when the following 15 comparators are "1":
etc . . . .
until
s=1111, when x16 is the minimum, or when the following 15 comparators are "1":
. . .

Figure 5A:
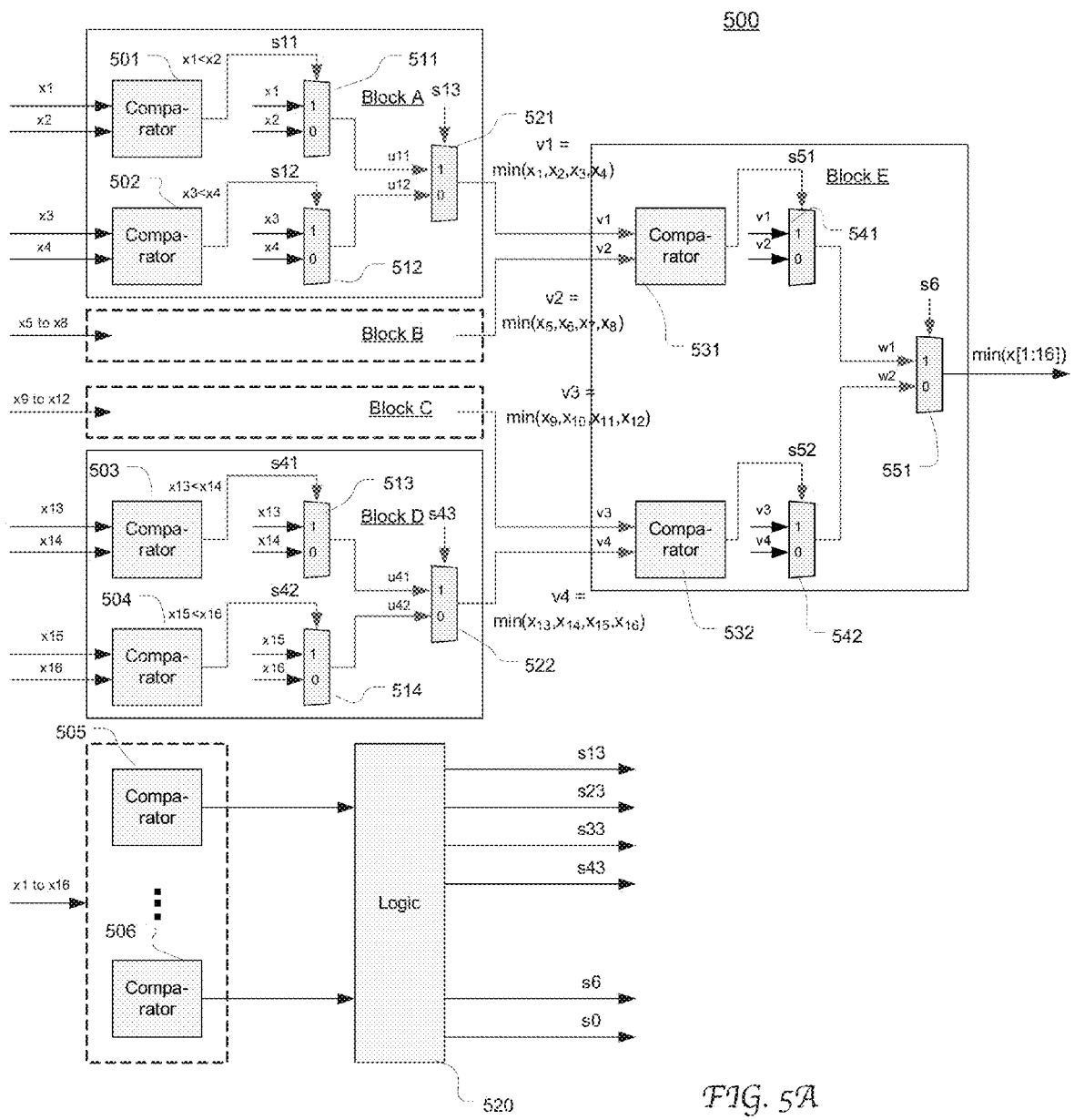
FIG. 5A illustrates the configuration of another exemplary compare-select component configured to select the minimum from 16 input values in accordance with an embodiment of the present disclosure.

FIG. 5A illustrates the configuration of another exemplary compare-select component 500 configured to select the minimum from 16 inputs x1-x16 in accordance with an embodiment of the present disclosure. Comparing with the implementation shown in FIG. 4, this embodiment features a simpler configuration but with additional latency. As shown, a second stage of comparator 531 and 532 are used to simplify the generation of the select signals and reduce the total number of comparators as the first level comparators (e.g., 501, 502 and 503) do not need to compare all possible pairs.

More specifically, the compare-select component 500 includes 5 sub-blocks (Blocks A-E), each used to find the minimum of 4 values, such as min(x(1:4)) and min (v(1:4)). Compared with the embodiment shown in FIG. 6, the total number of comparators is reduced because there is no need to compare between 2 values that belong to two different groups of 4 inputs. The latency is increased due to the additional stage of comparators that can be applied after the output of the first stage is available.

The select of the second multiplexer of each sub-block, e.g., s13=(u11<u12), depends only on the 4 inputs of that sub-block, e.g., x(1:4).

$$s13=(x1<x3)*(x1<x4)+(x2<x3)*(x2<x4)$$

As has been shown above, the selection s13 is 1 when x1 is the minimum or x2 is the minimum, which ensures that x1 is smaller than x3 and x4. The relationship between x1 and x2 does not matter because u11 is min(x1,x2). Similarly, if x2 is the minimum, x2 is compared to x3 and x4, and the relationship between x1 and x2 is irrelevant.

s13=1 when selecting u11, or when x1 or x2 is the minimum:
x1 is the minimum when:
x1<x2=y1 (the relationship between, x1 & x2 does not matter. Thus ignore this requirement.)
x1<x3=y2
x1<x4=y3
x2 is the minimum when;
x2<x1=y1 (we don't care about the relationship between x1 & x2. Thus ignore this requirement.)
x2<x3=y5
x2<x4=y6
Thus, s13 is given by:

$$s13=y1*y2*y3+y1'*y5*y6$$

s13 can be implemented via a multiplexer where the selection is based on y1. Since it does not matter if the minimum is x1 or x2, y1 can be ignored. Therefore $$s13=y2*y3+y5*y6$$

The same principles can be applied in obtaining s51, where:

$$s51=(v1<v2)$$

$$s52=(v3<v4).$$

Figure 5B:
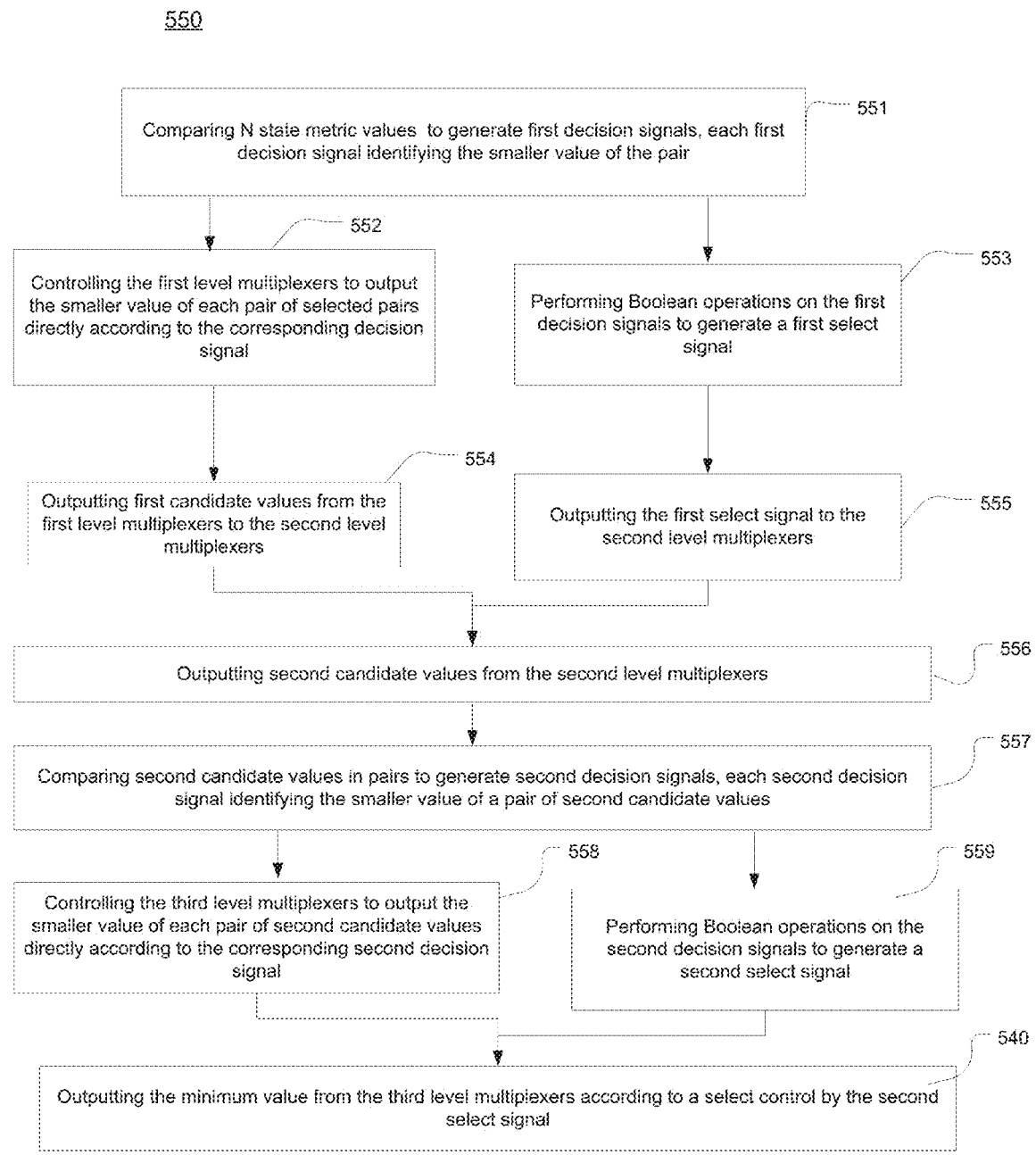
FIG. 5B is a flow chart depicting an exemplary method of comparing-selecting a value from N input state metric values according to still another embodiment of the present disclosure.

FIG. 5B is a flow chart depicting an exemplary method 550 of comparing-selecting a value from N input state metric values according to still another embodiment of the present disclosure. Method 550 may be performed by the compare-select component 500 in FIG. 5 if N is equal to 16.

At 551, the N state metric values are compared in pairs to generate first decision signals, each first decision signals identifying the smaller of the pair. In some embodiments. N state metric values are divided into M blocks. This first stage comparison can be performed on all possible pairs within each block, whereas the values across different blocks are not compared.

The first decision signals are processed in two paths in parallel. At 552, the first decision signals are directly used to control the first level multiplexers to output the smaller of each pair of the selected pairs. The selected pairs may be composed of distinct pairs within each block. At 554, the first candidate values are output from the first level multiplexers and sent to the second level multiplexers.

Concurrently with the first level multiplexing at 552 and 554, Boolean operations are performed on the first decision signals to generate a first select signal at 553. At 555, the first select signal is output to the second level multiplexers.

At 556, the second candidate values are output from the second level multiplexer responsive to the first select signal. For example, each second candidate value is the minimum of 4 input state metric values. At 557, the second candidate values are compared in pairs to generate second decision signals, where each second decision signal Indicates the smaller of each pair of the second candidate values.

The second decision signals are then processed in two paths 558 and 559 in parallel. At 558, the second decision signals, are directly used to control the third level multiplexers to output the smaller of each pair of second candidate values. At 559, Boolean operations are performed on the second decision signals to generate a second select signal. At 540, in response to the second select signal, the third level multiplexer outputs the minimum value of the N input.

Figure 6:
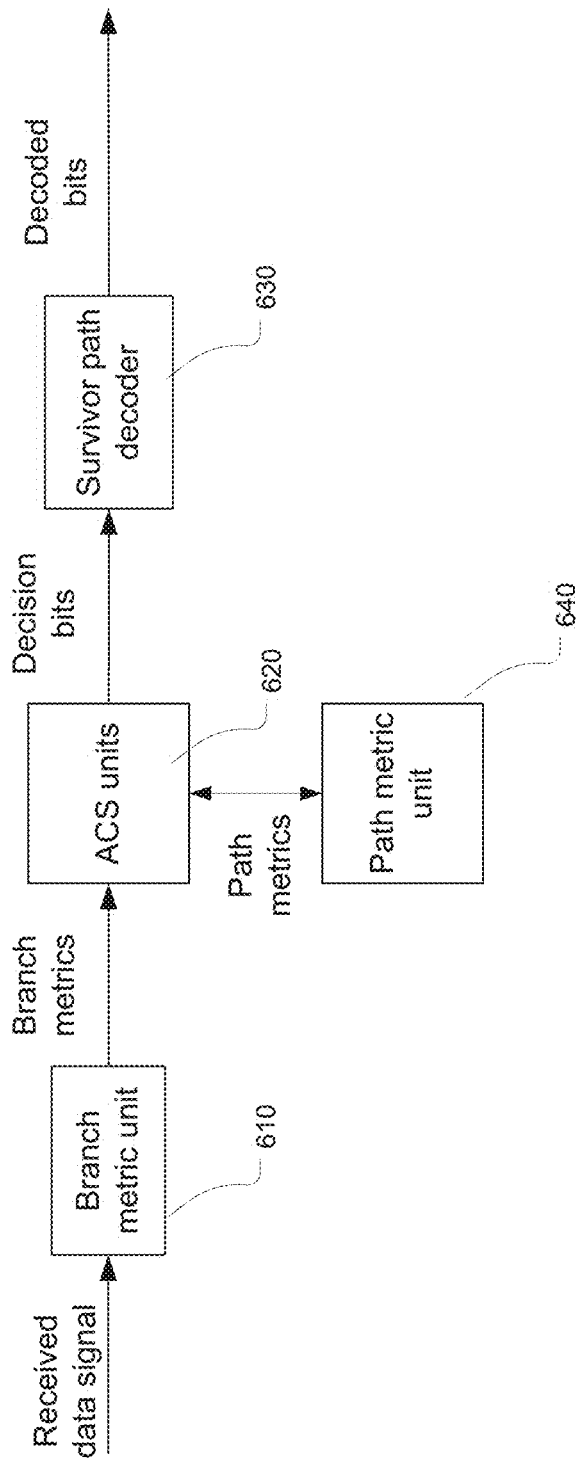
FIG. 6 illustrates an exemplary Viterbi decoder equipped with a low-latency ACS unit in accordance with an embodiment of the present disclosure.

FIG. 6 illustrates an exemplary Viterbi decoder 600 equipped with a low-latency ACS unit in accordance with an embodiment of the present disclosure. In a basic form, the Viterbi decoder 600 includes a branch metric unit 610, an ACS unit 620, a survivor path decoder 630 and a path metric unit 640. The ACS unit 620 includes low-latency and low-gate count compare-select components according to an embodiment of the present disclosure, as described in detail with reference to FIGS. 2A-5B.

The signal received at the input of the Viterbi decoder 600 is convolution-coded. The branch metric unit 610 calculates the branch metrics indicating the distances between the received data signal and the ideal data signal. The branch metrics are fed into the ACS unit 620 that recursively computes the path metrics and outputs path selection decision bits for each possible state transition. The decision bits are read out for a maximum likelihood decision for the survivor path decoder 630 to decode the source bits along the final survivor path. The path metrics of the current iteration are stored in the path metric unit (PMU) 640. The decoded data bit is then sent to a data sink (not shown) for further data processing. The components shown in the Viterbi decoder 600 may perform various other functions that are well known in the art. Further, it will be appreciated that a Viterbi decoder according to the present disclosure may include various other components that are well known in the art.

What is claimed is:

1. A method of using an Add-Compare Select (ACS) unit to select a state metric value from a plurality of state metric values in Viterbi decoding, said method comprising:
    comparing said plurality of state metric values in all possible pairs by using comparators to produce a plurality of first decision signals, wherein a respective first decision signal is generated by a comparator and indicates a selected state metric value from a corresponding pair of state metric values;
    generating a first select signal by using a logic circuit to perform Boolean operations on said plurality of first decision signals, wherein said logic circuit is coupled to said comparators; and
    selecting a resultant state metric value from said plurality of state metric values by using a multiplexing structure based on said first select signal.

2. The method as described in claim 1, wherein: the respective first decision signal indicates a smaller value between said corresponding pair of state metric values, and wherein said resultant state metric value is a minimum value among said plurality of state metric values.

3. The method as described in claim 1, wherein said first select signal comprises a plurality of bits, wherein said generating comprises said logic circuit generating a respective bit of said first select signal by performing said Boolean operations on said plurality of first decision signals, and wherein said selecting comprises:
    providing said first select signal to select lines of said multiplexer structure, wherein said multiplexer structure receives said plurality of state metric values as input; and
    outputting said resultant state metric value from said multiplexer structure.

4. The method as described in claim 1 further comprising:
    feeding selected pairs of said plurality of state metric values to input of a first plurality of 2:1 multiplexers;
    in parallel with said generating said first select signal, sending first decision signals that are resulted from said comparing and are associated with said selected pairs to select lines of said first plurality of 2:1 multiplexers; and
    outputting first candidate state metric values from said first plurality of 2:1 multiplexers.

5. The method as described in claim 4, wherein said selecting said resultant state metric value comprises:
    feeding said first candidate state metric values to input of said multiplexer structure;
    sending said first select signal to select lines of said multiplexer structure; and
    outputting said resultant metric value from said multiplexer structure.

6. The method as described in claim 5, wherein said multiplexer structure comprises a hierarchy of 2:1 multiplexers, and wherein each select line in said multiplexer structure corresponds to a respective bit of said first select signal.

7. The method as described in claim 4, wherein said selecting said resultant state metric value comprises:
    feeding said first candidate state metric values to input of a second plurality of 2:1 multiplexers;
    sending said first select signal to select lines of said second plurality of 2:1 multiplexers;

outputting second candidate state metric values from said
second plurality of multiplexers;
comparing said second candidate state metric values in
pairs to generate second decision signals; and
selecting said resultant state metric value from said second candidate metric values based on Boolean operations applied on said second decision signals.

8. An Add-Compare Select (ACS) unit for a high speed Viterbi decoder, said ACS unit comprises:
a plurality of first comparators configured to: compare a plurality of state metric values in all possible pairs; and produce a plurality of first decision signals, each resulting from comparing a respective pair of said all possible pairs;
a logic circuit coupled to said plurality of first comparators and configured to: perform Boolean operations on said plurality of first decision signals; and produce a first select signal; and
a multiplexer structure configured to: receive said plurality of state metric values as input; and output a resultant state metric value, wherein a select line of said multiplexer structure is controlled by said first select signal.

9. The ACS unit as described in claim 8, wherein: said plurality of state metric values comprise N values; said plurality of first comparators comprise $$\frac{N(N-1)}{2}$$

comparators; said multiplexer structure comprises a N:1 multiplexer; and each bit of said first select signal is generated from said Boolean operations on said plurality of first decision signals.

10. The ACS unit as described in claim 8, wherein said multiplexer structure comprises a hierarchy of multiplexers, wherein said hierarchy comprises:
first 2:1 multiplexers at a root level and configured to:
receive said plurality of state metric values as input; and
output first candidate state metric values responsive to select control by said first plurality of decision signals; and
an upper level multiplexer configured to output said resultant state metric value responsive to select control by said first select signal.

11. The ACS unit as described in claim 10, wherein said Boolean operations are performed in parallel with said first 2:1 multiplexers outputting said first candidate state metric values.

12. The ACS unit as described in claim 10, wherein said upper level multiplexer comprises multiple layers of second 2:1 multiplexers, and wherein further a select line of each second 2:1 multiplexer is coupled to an output of said Boolean operation.

13. The ACS unit as described in claim 8, wherein said multiplexer structure comprises:
first level multiplexers configured to:
receive said plurality of state metric values as input; and
output first candidate state metric values responsive to select control by said first plurality of decision signals; and
second level multiplexers configured to:
receive said first candidate state metric values as input; and
output second first candidate state metric values responsive to select control by said first select signal, and
further comprising:
a plurality of second comparators configured to: compare said second candidate state metric values in pairs; and produce a plurality of second decision signals; and
third level multiplexers configured to:
receive said second candidate state metric values as input; and
output third candidate state metric values responsive to select control by said plurality of second decision signals.

14. The ACS unit as described in claim 13, wherein said logic circuit is further configured to:
perform Boolean operations on said plurality of second decision signals; and
produce a second select signal,
and further comprising fourth level multiplexers configured to:
receive said third candidate state metric values as input; and
output said resultant state metric value responsive to select control by said second select signal.

15. A system for decoding convolution-coded data, said system comprising:
an Add-Compare Select (ACS) unit comprising:
a plurality of first comparators configured to compare a plurality of state metric values in all possible pairs; and produce a plurality of first decision signals, each resulting from comparing a respective pair of said all possible pairs;
a logic circuit coupled to said plurality of first comparators and configured to: perform Boolean operations on said plurality of first decision signals; and produce a first select signal; and
a multiplexer structure configured to: receive said plurality of state metric values as input; and output a resultant state metric value, wherein a select line of said multiplexer structure is controlled by said first select signal.

16. The system as described in claim 15, further comprising:
a branch metric unit coupled to said ACS and configured to generate branch metric values, wherein said state metrics values are generated at said ACS unit based on said branch metric values according to a Viterbi algorithm; and
a survivor path decoder coupled to said ACS unit and configured to generate decoded bits according to said resultant state metric value.

17. The system as described in claim 15, wherein said multiplexer structure comprises a hierarchy of multiplexers, wherein said hierarchy comprises:
first 2:1 multiplexers at a root level and configured to:
receive said plurality of state metric values as input; and
output first candidate state metric values responsive to select control by said first plurality of decision signals; and
an upper level multiplexer configured to output said resultant state metric value responsive to select control by said first select signal,
wherein said Boolean operations are performed concurrently with said first 2:1 multiplexers outputting said first candidate state metric values.

18. The system as described in claim 15, wherein said multiplexer structure comprises:
- a first level of multiplexers configured to:
  - receive said plurality of state metric values as input; and
  - output first candidate state metric values responsive to select control by said first plurality of decision signals; and
- a second level of multiplexers configured to:
  - receive said first candidate state metric values as input; and
  - output second first candidate state metric values responsive to select control by said first select signal, and further comprising:
- a plurality of second comparators configured to: compare said second candidate state metric values in pairs; and produce a plurality of second decision signals;
- a third level of multiplexers configured to:
  - receive said second candidate state metric values as input; and
  - output third candidate state metric values responsive to select control by said plurality of second decision signals.

19. The system as described in claim 18, wherein said logic circuit is further configured to:
- perform Boolean operations on said plurality of second decision signals; and
- produce a second select signal, and further comprising a fourth level of multiplexers configured to:
- receive said third candidate state metric values as input; and
- output said resultant state metric value responsive to select control by said second select signal.

* * * * *